(12) United States Patent
Hedler et al.

(10) Patent No.: US 7,037,761 B2
(45) Date of Patent: May 2, 2006

(54) METHOD OF PRODUCING AN ELECTRONIC COMPONENT

(75) Inventors: Harry Hedler, Germering (DE); Bernd Römer, Bernhardswald (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/030,799

(22) Filed: Jan. 7, 2005

(65) Prior Publication Data
US 2005/0124094 A1 Jun. 9, 2005

Related U.S. Application Data

(62) Division of application No. 10/056,356, filed on Jan. 24, 2002, now Pat. No. 6,858,799.

(30) Foreign Application Priority Data
Jan. 24, 2001 (DE) .................. 101 03 186

(51) Int. Cl.
*H01L 21/44* (2006.01)
(52) U.S. Cl. .................. 438/127; 438/113; 438/114; 438/126
(58) Field of Classification Search .................. None
See application file for complete search history.

(56) References Cited

U.S. PATENT DOCUMENTS

| | | | |
|---|---|---|---|
| 5,879,964 A | | 3/1999 | Paik et al. |
| 5,888,850 A | * | 3/1999 | Havens et al. .............. 438/127 |
| 5,956,605 A | | 9/1999 | Akram et al. |
| 6,255,142 B1 | * | 7/2001 | Babiarz et al. ............. 438/126 |
| 6,537,482 B1 | | 3/2003 | Farnworth |

FOREIGN PATENT DOCUMENTS

| | | |
|---|---|---|
| DE | 197 28 992 A1 | 1/1999 |
| JP | 10 316 955 A | 12/1998 |

* cited by examiner

*Primary Examiner*—Luan Thai
(74) *Attorney, Agent, or Firm*—Laurence A. Greenberg; Werner H. Stemer; Ralph E. Locher

(57) ABSTRACT

An electronic component includes a semiconductor chip that has an active upper side with integrated circuits and a passive rear side. The rear side and the side border regions of the semiconductor chip also form the outer package sides of the electronic component. At least the corner regions and the edge regions of the rear side and the side border regions of the semiconductor chip have a plastic coating with a thickness in the micrometer range. Furthermore, the invention relates to a method of producing such an electronic component.

15 Claims, 2 Drawing Sheets

METHOD OF PRODUCING AN ELECTRONIC COMPONENT

CROSS-REFERENCE TO RELATED APPLICATIONS

This is a division of application Ser. No. 10/056,356, filed Jan. 24, 2002, now U.S. Pat. No. 6,858,799; the application also claims the priority, under 35 U.S.C. §119, of German patent application No. 101 03 186.6-33, filed Jan. 24, 2001; the prior applications are herewith incorporated by reference in their entirety.

BACKGROUND OF THE INVENTION

Field of the Invention

The invention relates to a method for producing an electronic component with a semiconductor chip, in which the rear side and the side border regions of the semiconductor chip form outer package sides.

Electronic components in which the outer package sides are partly formed by the surfaces of a semiconductor chip are susceptible to an increased risk of breakage, in particular during transportation and further processing. Furthermore, these chip size packages (CSPs), as they are known, are susceptible to an increased risk of breakage during functional tests in corresponding testing installations. For example, an electronic component is inserted into a measuring enclosure for testing the electronic component up to ten times, depending on the product. As this happens, the edges and side border regions often come into contact with guides and receptacles of the testing apparatus. These instances of contact lead to spalling of the crystalline semiconductor material of the chips, which in turn leads to rejection of the chips. The loss during testing operations caused by these instances of edge and side contact lies around 3%.

SUMMARY OF THE INVENTION

It is accordingly an object of the invention to provide a method for producing the electronic component which overcomes the above-mentioned disadvantages of the prior art apparatus and methods of this general type.

In particular, it is an object of the invention to reduce the level of rejection and loss during testing and during further processing of such electronic components with semiconductor chips.

With the foregoing and other objects in view there is provided, in accordance with the invention, an electronic component having a semiconductor chip that has an active upper side with integrated circuits and a passive rear side. The rear side and side border regions of the semiconductor chip at the same time form outer package sides. At least the corner and edge regions of the rear side and the side border regions of the semiconductor chip have a plastic coating with a thickness in the micrometer range. The micrometer range with respect to the thickness of the plastic coating concerns thicknesses between 0.5 µm and 50 µm, and preferably below 15 µm.

Such a thin plastic coating in the micrometer range adapts by its micro-flowing processes to the thermally induced expansions of the semiconductor chip, even under extreme thermal loading. Furthermore, because of micro-flowing processes of the thin plastic coating, no notches or cracks occur in the protective layer for the corner, edge and border regions of the semiconductor chip. Rather, micro-cracks in the semiconductor material in the border region of the semiconductor chips are adhesively bonded. Furthermore, stress peaks that are introduced in corners, edges and border regions during the process of separating a semiconductor wafer into semiconductor chips are reduced by the coating in the micrometer range. Thick coatings above the stated micrometer range cannot perform this compensating function, with the result that plastic coatings of this type used as edge protection are liable to peel off from the semiconductor material, with the result that more major and technically complex processes have to be provided to ensure the adherence of thick plastic coatings as an edge protection in the border region of the semiconductor chips.

In accordance with an added feature of the invention, the rear side of the semiconductor chip is completely covered by the plastic coating. This feature has the advantage that the plastic coating can be arranged on the rear side of a semiconductor chip at relatively low cost, since in this embodiment no structures on the rear side of the semiconductor chip have to be kept free.

In accordance with an additional feature of the invention, the plastic coating in the softened or melted state does not wet surfaces of other solid plastic materials and wets surfaces of semiconductor materials. Such a material, when used for the plastic coating has the advantage that the entire rear side of the semiconductor chip, which has no solid plastic parts, can also be wetted by the plastic coating in the softened and melted state. Furthermore, the side border regions of a semiconductor chip, which after sawing, likewise only has surfaces of semiconductor materials, can be wetted in a covering manner by the material of the plastic coating in the melted or softened state. The structures on the active upper side of the chip, which essentially have solid plastic materials with metallic conductor tracks and external contact elements, remain free of the material of the plastic coating in the softened and melted state.

In accordance with another feature of the invention, the plastic coating in the softened or melted state is adhesive with respect to semiconductor surfaces. This property of the plastic coating ensures that the semiconductor surfaces are intensively wetted by the plastic coating in the softened or melted state and that micro-crack formations in the border region of the semiconductor chip are bonded.

In accordance with a further feature of the invention, the plastic coating has a polymer or copolymer. Such polymers or copolymers may form thermoplastics, which melt when heated and solidify when cooled. In some cases, the viscosity of such polymers or copolymers is reduced in such a way that they can wet semiconductor surfaces extremely thinly in the submicrometer range.

In accordance with a further added feature of the invention, the plastic coating has colophony, disproportionated colophony or esterified colophony. Plastic coatings which have such a material are extremely inexpensive and can consequently be applied to the surfaces of the semiconductor chips at low cost.

In accordance with a further additional feature of the invention, it is provided that the plastic coating has a phthalate resin, preferably a dimethyl glycol phthalate. Such phthalate resins soften and melt at temperatures below 100° C. and wet semiconductor materials, in particular silicon, completely uniformly and exhibit reduced wetting properties and reduced adhesion on solid plastic surfaces in comparison with semiconductor surfaces. These plastic coatings therefore have the advantage that they selectively wet only those surfaces of the semiconductor chip which are intended as outer package sides and are therefore exposed to increased loads during the testing process.

In accordance with yet an added feature of the invention, the plastic coating has color pigments. With such color pigments, the semiconductor chip can be inscribed and marked at the same time as the plastic coating is applied.

In accordance with yet an additional feature of the invention, the semiconductor chip has silicon. Silicon is a widespread base material for semiconductor structures and is used in particular in the case of large memory chips and logic chips. The hardness and strength and also the oxidation resistance enable the silicon surface to be used directly as the outer package surface. It is consequently possible to protect just the chip edges, corners and border regions and to leave the greater part of the rear side of the semiconductor chip free.

In accordance with yet another feature of the invention, the semiconductor chip has a crystal orientation of <100>, since this crystal orientation allows micro-cracks at right angles, but to the greatest extent suppresses micro-cracks at the other remaining angles. The property of this special crystal orientation promotes separating joins at right angles to one another and suppresses micro-cracks at any other angles into the active chip volume.

With the foregoing and other objects in view there is provided, in accordance with the invention, a method of producing an electronic component having a semiconductor chip with a rear side and side border regions in which the rear side and the side border regions form outer package sides. The method includes steps of: providing a semiconductor wafer having a rear side and a plurality of semiconductor chips; immediately before separating individual ones of the plurality of the semiconductor chips, applying a plastic coating having a thickness in a micrometer range to the rear side of the semiconductor wafer; separating the individual ones of the plurality of the semiconductor chips to obtain separated semiconductor chips; thermally treating the separated semiconductor chips to perform a function selected from the group consisting of softening the plastic coating and melting the plastic coating; using the plastic coating on the rear side of one of the separated semiconductor chips to wet corner regions, edge regions, and side border regions of the one of the separated semiconductor chips; and completing the one of the separated semiconductor chips to form a packaged electronic component in which the rear side and the side border regions of the one of the separated semiconductor chips form outer faces of a package.

In accordance with an added mode of the invention, a printing technique is used to perform the step of applying the plastic coating to the semiconductor wafer.

In accordance with an additional mode of the invention, a screen printing technique is used to perform the step of applying the plastic coating to the semiconductor wafer.

In accordance with another mode of the invention, a spraying technique is used to perform the step of applying the plastic coating to the semiconductor wafer.

In accordance with a further mode of the invention, a centrifuging technique is used to perform the step of applying the plastic coating to the semiconductor wafer.

In accordance with a further added mode of the invention, an immersion technique is used to perform the step of applying the plastic coating to the semiconductor wafer.

In accordance with a further additional mode of the invention, during a thermal treatment step that is used to package the one of the separated semiconductor chips, the thermally treating step is performed and the step of using the plastic coating on the rear side of the one of the separated semiconductor chips to wet the corner regions, the edge regions, and the side border regions of the one of the separated semiconductor chips is performed.

In accordance with yet an added mode of the invention, separating joins are provided for separating the plurality of the semiconductor chips; and the step of applying the plastic coating is performed by selectively applying the plastic coating to the rear side of the semiconductor wafer such that at least all of the separating joins are covered by a width of the plastic coating that corresponds to at least twice a width of the separating joins.

Such a method has the advantage that protection for the rear side and the side border regions can be produced for a plurality of semiconductor chips at the same time by a plastic coating having a thickness in the micrometer range, without introducing expensive method steps in the production of electronic components. A surface-covering and selective coating of semiconductor wafers can be carried out relatively inexpensively. All that is required for this purpose is for the plastic for the plastic coating to be applied in a liquid form to the entire rear side face of the semiconductor chip or selectively through a mask or a screen. After this plastic coating has become solid, the semiconductor wafer can be further treated by semiconductor technology.

In an implementational example of the method, the plastic coating is selectively applied to the rear side of the semiconductor wafer, i.e. only in regions in which a plastic coating is required, and the coating is intended to be distributed over the corner and edge regions onto the side border regions of a semiconductor chip. For this purpose, at least the positions of all the separating joins for the semiconductor chips are covered in a predetermined width on the rear side of the semiconductor wafer. The width of the selective plastic coating on the separating joins for the semiconductor chips corresponds to at least twice the width of the separating joins. This has the advantage that a relatively coarse alignment of the pattern of the selective plastic coating can be allowed on the rear side of the semiconductor wafer and it does not have to have the precision required for separating the semiconductor chips. The wider the strips of the plastic coating are on the rear side of the semiconductor chip, the more generously the alignment of the rear side can be carried out with respect to the separating joins, which considerably reduces the cost of the adjusting step and also the adjusting device that is required for it.

A further implementational example of the method provides that the plastic coating is applied to the semiconductor wafer using a printing technique, preferably a screen printing technique. With such a printing technique, a selective plastic coating can be achieved inexpensively, since the introduction or application of the plastic coating to the rear side of the semiconductor wafer is performed only where the print master or stencil provides for this.

In a further implementational example of the method, the plastic coating is applied onto the semiconductor wafer by a spraying technique. If this spraying technique is performed through a mask, here, too, a selective application can be realized in a relatively simple way. However, the spraying technique has special advantages whenever the rear side of the semiconductor wafer is to be completely uniformly covered with an extremely thin plastic coating in the sub-micrometer range.

A uniform coating on the rear side of the semiconductor wafer can be obtained in a further implementational example of the method by using a centrifuging technique. The centrifuging technique has the advantage that extremely thin plastic coatings can be produced, partly in the submicrometer range, i.e. below 1 µm, with uniform thickness.

In a further implementational example of the method, the plastic coating on the rear side of the semiconductor wafer is performed by using an immersion technique. In an immersion technique, thicknesses that lie in the upper range of the micrometer range are achieved, that is in the range between 5 and 50 µm. This immersion technique has the advantage that a great number of wafers can be immersed into a bath of polymer melt at the same time using a corresponding rack, and it therefore entails particularly low cost and is suitable for mass production.

A further implementational example of the method provides that the softening and/or melting of the plastic coating and the wetting of the corner and edge regions and of the side border regions of the semiconductor chip are performed at the same time as one of the thermal treatment steps that is performed during the packaging of the semiconductor chip. Such packaging steps are, for example, the "reflow" process, in which solder bumps are fused onto a wiring film. With such a combination between production steps during the packaging of the semiconductor chip and the wetting step for the corner and edge regions and also the side border regions of the semiconductor chip, it is possible to reduce the cost of applying the plastic coating for protecting the corner and edge regions on the rear side of the semiconductor chip and for protecting the side border regions of the semiconductor chip.

With this invention, protection on the rear side and on the chip edges created by the sawing process is produced in a simple way. This protection essentially includes a thin layer which is flexible enough to absorb hard knocks against the chip edge. This thin layer can be made by coating the rear side of the chip and the chip edges in two steps. First, the protective material is applied on the rear side of each chip, to be precise preferably also on the wafer level. In one embodiment of the invention, only the regions with at least twice the width of the mirrored sawing route structure are applied on the rear side of the chip.

In one embodiment of the invention, this application process may be performed by printing. After that, in a second step, which follows the sawing, energy is provided for melting the protective material. As this happens, the protective material runs over the chip edges because of the wetting properties of the melted protective material. Surfaces of semiconductor crystals protected by manageable process steps can be produced in this way. This operation can be controlled, in that materials which predominantly wet the bare crystal surfaces but stop at the solid polymer surfaces intended for the upper side of the chip are specifically used. Consequently, the upper side of the chip is not adversely affected by the wetting with the plastic coating.

Other features which are considered as characteristic for the invention are set forth in the appended claims.

Although the invention is illustrated and described herein as embodied in a method of producing an electronic component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
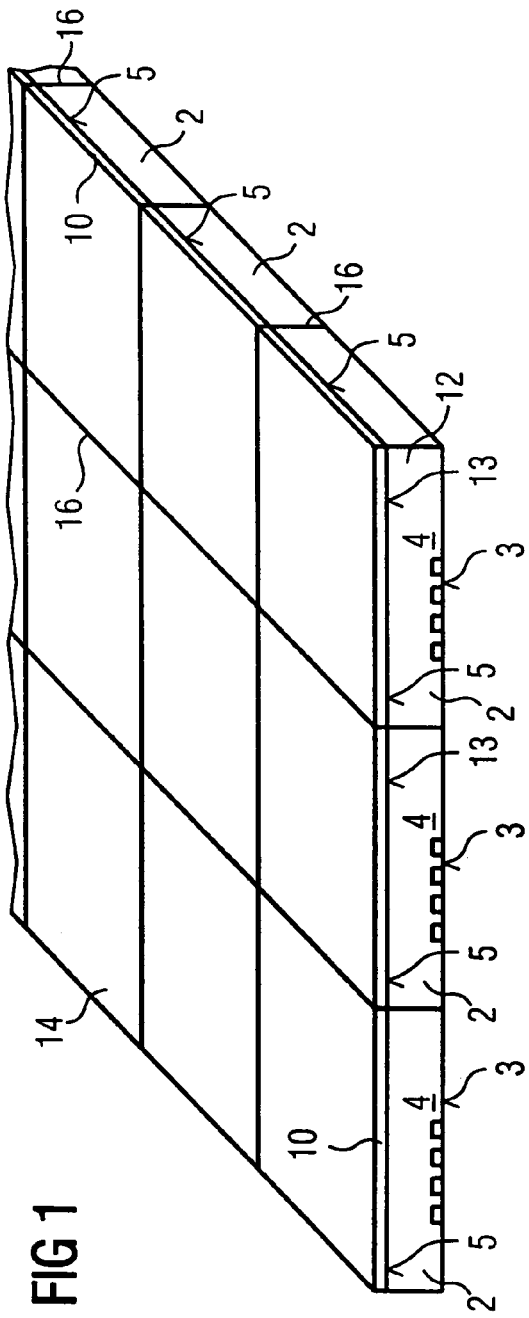
FIG. 1 shows a perspective view of a portion of a semiconductor wafer for illustrating a first embodiment of the invention.

Referring now to the figures of the drawing in detail and first, particularly, to FIG. 1 thereof, there is shown a perspective view a portion of a semiconductor wafer 14 to illustrate a first embodiment of the invention. In FIG. 1, reference numeral 2 identifies semiconductor chips of the semiconductor wafer 14, reference numeral 3 denotes the active upper side of the semiconductor chip 2, reference numeral 4 identifies integrated circuits that are positioned in the vicinity of the active upper side 3 of the semiconductor chip 2, reference numeral 5 identifies a passive rear side of the respective semiconductor chip 2, and reference numeral 10 identifies a plastic coating on the semiconductor wafer 14.

FIG. 1 shows a portion of a semiconductor wafer 14 with new semiconductor chips, the solid lines on the surface of the plastic coating 10 are intended to show the position and situation of the separating joins 16 for the individual semiconductor chips 2. Since the separation itself takes place from the active upper side 3 of the semiconductor wafer 14, the saw blade can be guided exactly along the intended sawing routes or the separating joins 16. The closed plastic coating 10 of the semiconductor wafer is also then automatically divided up into individual regions along the separating joins 16.

The plastic coating 10 would only protect the rear side 5 of a semiconductor chip 2 from damage when the semiconductor chip 2 is cut out from a semiconductor wafer 14 in this way. Therefore, after the semiconductor wafer 14 has been divided up into individual semiconductor chips 2, the closed plastic coating 10 on the rear side of the semiconductor chip 2 is melted in a thermal treatment, and because of its properties for wetting semiconductor materials, the melted material of the plastic coating 10 also wets the edge regions, the corner regions, and the side border regions of the semiconductor chip 2. This thermal step may be combined with a thermal step that is required in the further packaging of the electronic component.

Figure 2:
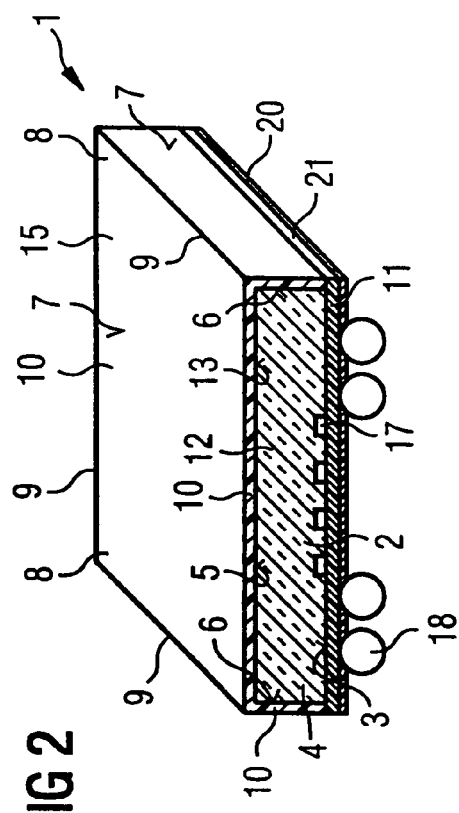
FIG. 2 shows a perspective view of a first embodiment of the invention that includes a transversely cut semiconductor chip.

FIG. 2 schematically shows a perspective view of a first embodiment of the invention which is an electronic component 1 that includes a transversely cut semiconductor chip 2. Components that perform the same functions as the components shown in FIG. 1 are identified by the same reference numerals. Therefore, no explanation of these components is given. The reference numeral 6 denotes side border regions of the semiconductor chip 2 and the reference numeral 7 denotes outer package sides of the electronic component 1. The reference numerals 8 denote corner regions and the reference numerals 9 denote edge regions of the electronic component 1. The reference numeral 11 identifies another plastic material, other than the plastic material of the plastic coating 10. This other plastic material 11 is used on the active surface 3 of the semiconductor chip as a wiring film 21. The wiring film 21 has, in addition to a plastic insulating film, a structured metal lamination that connects the contact areas 17 of the semiconductor chip to the external contact elements 18. The metal lamination of the wiring film 21 not occupied by external contact elements 18 is protected by a solder resist layer 20. In this embodiment of the invention, the external contact elements 18 are solder balls, which make it possible for the integrated circuits 4 of the integrated semiconductor chip 2 to be connected directly to a printed circuit board or a ceramic module.

Because the plastic coating has a thickness in the micrometer and submicrometer range, the size of the electronic component 1 corresponds essentially to the size of the semiconductor chip 2. The electronic component 1 is only a few micrometers or fractions of a micrometer larger than the original semiconductor chip 2. Nevertheless, the electronic component 1 is protected against damage because of the microscopically thin plastic coating, with the result that the rate of loss during testing and during further processing can be significantly reduced.

Figure 3:
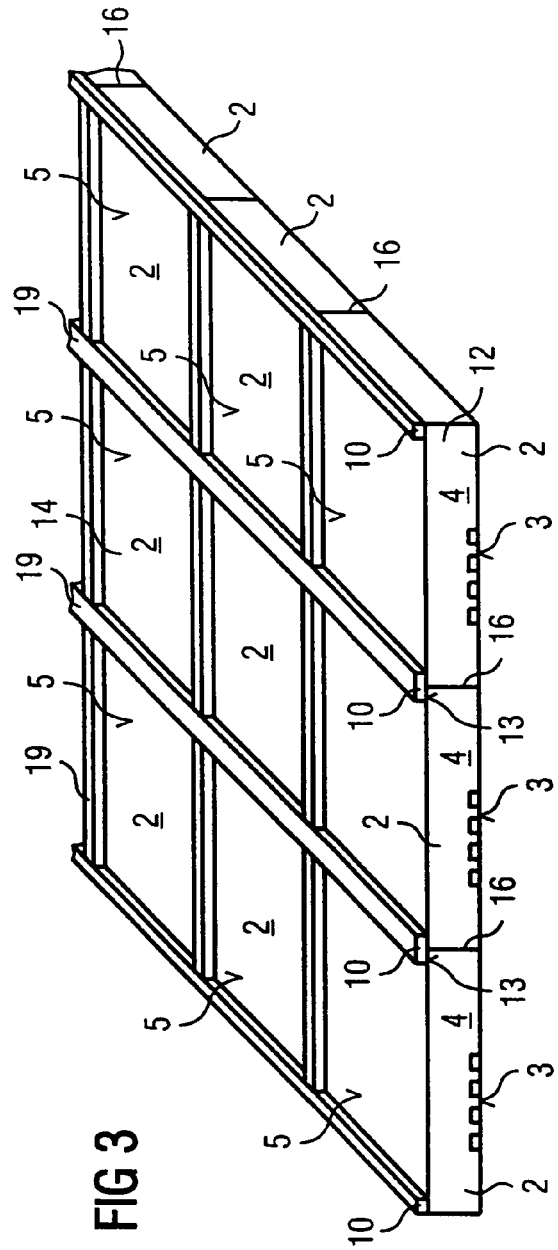
FIG. 3 shows a perspective view of a portion of a semiconductor wafer for illustrating a second embodiment of the invention.

FIG. 3 shows a perspective view of a portion of a semiconductor wafer 14 for illustrating a second embodiment of the invention. Components shown in FIG. 3 that have the same functions as the components shown in FIG. 1 or in FIG. 2 have been identified by the same reference numerals and no additional explanation of these components has been given.

The second embodiment of the semiconductor wafer 14 differs from the first embodiment shown in FIG. 1 in that the plastic coating 10 has been applied selectively and has only been applied in the positions of the separating joins 16 on the rear side 5 of the semiconductor wafer 14. This selective application can be performed using a screen printing process or by spraying the plastic coating through a mask. After the semiconductor wafer 14 has been separated into individual semiconductor chips 2, a thermal treatment causes the plastic coating 10 to run along the corner and edge regions on the side border regions of the semiconductor chips 2 and protects them with a microscopically thin plastic coating.

Figure 4:
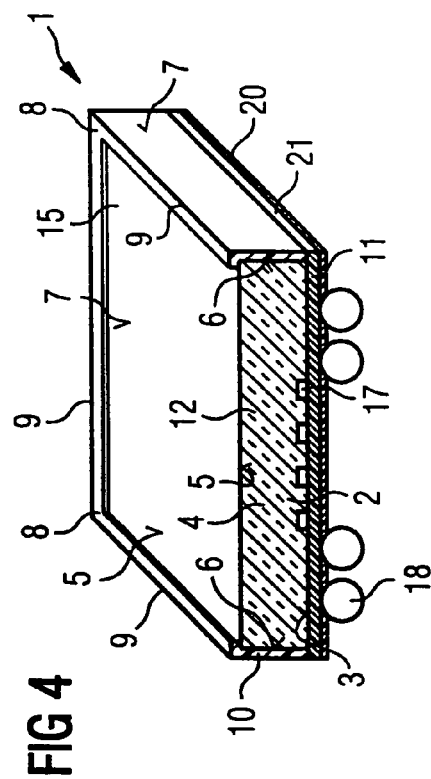
FIG. 4 shows a perspective view of a second embodiment of the invention that includes a transversely cut semiconductor chip.

FIG. 4 shows a perspective view of a second embodiment of the invention that includes a transversely cut semiconductor chip. Components of FIG. 4 that perform the same functions as components shown in FIGS. 1 to 3 have been identified by the same reference numerals and have not been explained in any more detail.

In the embodiment of the invention shown in FIG. 4, the rear side 5 of the semiconductor chip 2 is for the most part left free and has no plastic coating. The surface of the rear side 5 of the semiconductor chip 2 directly forms the side of an outer package. It is possible for the unprotected rear side 5 of a semiconductor wafer 2 to be used directly as the outer package side for semiconductor materials that are resistant to oxidation and corrosion. These semiconductor materials include silicon, which in a damp and oxidizing atmosphere, forms an impenetrable protective silicon dioxide layer with good adhesion.

In the embodiment shown in FIG. 4, just the corner regions 8, the edge regions 9, and the side border regions 6 of the semiconductor chip 2 are provided with a plastic coating 10. For this purpose, the plastic webs 19 (shown in FIG. 3) of the plastic coating 10 melt by a thermal treatment. The corner regions 8, the edge regions 9 and the side border regions 6 of the semiconductor chip 2 are wetted and are consequently protected after the plastic layer has set. By suitably selecting the material of the plastic coating 10, only semiconductor surfaces of the semiconductor chip 2 are wetted by the melted plastic material, while the solid plastic material 11, which covers the active upper side 3 of the semiconductor chip 2, is wetted less or not at all by the plastic material of the plastic coating. Consequently, the plastic material for example of a wiring film 21 on the active upper side 3 of the semiconductor chip 2 remains free of any additional plastic coating. Consequently, the function of the external contact elements 18 is also not impaired during the operation of wetting and protecting the side border regions 6 of the semiconductor chip 2.

We claim:

1. A method of producing an electronic component having a semiconductor chip with a rear side and side border regions in which the rear side and the side border regions form outer package sides, the method which comprises:

providing a semiconductor wafer having a rear side and a plurality of semiconductor chips;

immediately before separating individual ones of the plurality of the semiconductor chips, applying a plastic coating having a thickness in a micrometer range to the rear side of the semiconductor wafer;

separating the individual ones of the plurality of the semiconductor chips to obtain separated semiconductor chips;

thermally treating the separated semiconductor chips to perform a function selected from the group consisting of softening the plastic coating and melting the plastic coating;

using the plastic coating on the rear side of one of the separated semiconductor chips to wet corner regions, edge regions, and side border regions of the one of the separated semiconductor chips; and completing the one of the separated semiconductor chips to form a packaged electronic component in which the rear side and the side border regions of the one of the separated semiconductor chips form outer faces of a package.

2. The method according to claim 1, which comprises using a printing technique to perform the step of applying the plastic coating to the semiconductor wafer.

3. The method according to claim 1, which comprises using a screen printing technique to perform the step of applying the plastic coating to the semiconductor wafer.

4. The method according to claim 1, which comprises using a spraying technique to perform the step of applying the plastic coating to the semiconductor wafer.

5. The method according to claim 1, which comprises using a centrifuging technique to perform the step of applying the plastic coating to the semiconductor wafer.

6. The method according to claim 1, which comprises using an immersion technique to perform the step of applying the plastic coating to the semiconductor wafer.

7. The method according to claim 1, which comprises, during a thermal treatment step that is used to package the one of the separated semiconductor chips, performing the thermally treating step and performing the step of using the plastic coating on the rear side of the one of the separated semiconductor chips to wet the corner regions, the edge regions, and the side border regions of the one of the separated semiconductor chips.

8. The method according to claim 1, which comprises:
providing separating joins for separating the plurality of the semiconductor chips; and
performing the step of applying the plastic coating by selectively applying the plastic coating to the rear side of the semiconductor wafer such that at least all of the separating joins are covered by a width of the plastic coating that corresponds to at least twice a width of the separating joins.

9. The method according to claim 8, which comprises performing the step of selectively applying the plastic coating to the rear side of the semiconductor wafer by spraying plastic of the plastic coating through a mask.

10. The method according to claim 8, which comprises using a printing technique to perform the step of applying the plastic coating to the semiconductor wafer.

11. The method according to claim 8, which comprises using a screen printing technique to perform the step of applying the plastic coating to the semiconductor wafer.

12. The method according to claim 8, which comprises using a spraying technique to perform the step of applying the plastic coating to the semiconductor wafer.

13. The method according to claim 8, which comprises using a centrifuging technique to perform the step of applying the plastic coating to the semiconductor wafer.

14. The method according to claim 8, which comprises using an immersion technique to perform the step of applying the plastic coating to the semiconductor wafer.

15. The method according to claim 8, which comprises, during a thermal treatment step that is used to package the one of the separated semiconductor chips, performing the thermally treating step and performing the step of using the plastic coating on the rear side of the one of the separated semiconductor chips to wet the corner regions, the edge regions, and the side border regions of the one of the separated semiconductor chips.

* * * * *